(12) United States Patent
Beseke et al.

(10) Patent No.: US 7,800,525 B2
(45) Date of Patent: Sep. 21, 2010

(54) METHOD FOR OPERATING A SENSOR SYSTEM AND SENSOR SYSTEM

(75) Inventors: Lars Beseke, Hamburg (DE); Leopold Beer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 12/313,318

(22) Filed: Nov. 18, 2008

(65) Prior Publication Data
US 2009/0146858 A1 Jun. 11, 2009

(30) Foreign Application Priority Data
Dec. 11, 2007 (DE) .................. 10 2007 059 536

(51) Int. Cl.
*H03M 1/12* (2006.01)
(52) U.S. Cl. .................. 341/155; 348/277; 348/272
(58) Field of Classification Search .................. 341/155; 348/277, 372, 362, 294; 382/100
See application file for complete search history.

(56) References Cited

U.S. PATENT DOCUMENTS

| | | | | |
|---|---|---|---|---|
| 5,528,698 | A * | 6/1996 | Kamei et al. .................. 382/100 |
| 7,129,985 | B1 * | 10/2006 | Koizumi et al. ............. 348/372 |
| 7,154,547 | B2 * | 12/2006 | Oda ........................... 348/277 |
| 2003/0011693 | A1 * | 1/2003 | Oda ........................... 348/272 |
| 2003/0142219 | A1 * | 7/2003 | McGarvey et al. ........ 348/222.1 |
| 2004/0008388 | A1 * | 1/2004 | Tanaka ........................ 358/513 |
| 2004/0212696 | A1 * | 10/2004 | Tsugita et al. ............ 348/231.6 |
| 2005/0122413 | A1 * | 6/2005 | Matsuyama .................. 348/272 |
| 2006/0082675 | A1 * | 4/2006 | McGarvey et al. ........... 348/362 |
| 2006/0250510 | A1 * | 11/2006 | Jacobs et al. ................. 348/294 |
| 2007/0046807 | A1 * | 3/2007 | Hamilton et al. ............. 348/362 |
| 2007/0146522 | A1 * | 6/2007 | Okada et al. ................. 348/311 |

FOREIGN PATENT DOCUMENTS

DE 102 34 094 2/2004

* cited by examiner

*Primary Examiner*—Jean B Jeanglaude
(74) *Attorney, Agent, or Firm*—Kenyon & Kenyon LLP

(57) ABSTRACT

A method is provided for operating a sensor system having a sensor, an analog-to-digital converter and a digital signal-processing device, an analog signal from the sensor being transmitted to the analog-to-digital converter, the analog signal being converted to a digital signal by the analog-to-digital converter with a sampling frequency, the digital signal being transmitted to the digital signal-processing device, and the analog signal further being transmitted to a clock generator, the sampling frequency of the analog-to-digital converter being controlled by the clock generator as a function of the analog signal.

19 Claims, 1 Drawing Sheet

METHOD FOR OPERATING A SENSOR SYSTEM AND SENSOR SYSTEM

FIELD OF THE INVENTION

The present invention is based on a method for operating a sensor system.

BACKGROUND INFORMATION

Such methods are generally familiar. For example, German patent document DE 102 34 094 A1 discusses a method for detecting a sensor signal, an analog signal output by a sensor being converted to a digital signal by an analog-to-digital converter in order subsequently to be processed in a digital signal-processing device. To adapt the dynamic range of the amplitude of the sensor signal to the requirements of the analog-to-digital converter, the analog signal is conducted through a low-pass filter upstream of the analog-to-digital converter, the transfer function of the low-pass filter being dependent on the analog signal itself. Adaptation of a sampling frequency of the analog-to-digital converter as a function of the analog signal is not provided.

SUMMARY OF THE INVENTION

In comparison to the related art, the method of the present invention for operating a sensor system and the sensor system according to the present invention as recited in the alternative independent claims have the advantage that the sampling frequency is controlled by the clock generator as a function of the analog signal. In this manner, the sampling frequency is adapted automatically to the requirements of the analog signal, so that the operating mode of the analog-to-digital converter is optimized, particularly with regard to the data availability and the energy consumption of the analog-to-digital converter. The energy consumption and the speed with which data is available are essentially a function of the sampling frequency of the analog-to-digital converter. For an inexpensive implementation of a sensor system in a vehicle, for instance, a comparatively low energy consumption of the analog-to-digital converter is a considerable advantage, since in particular, a compact design, coolant savings and/or a battery-operated sensor system are thus able to be realized. At the same time, however, a continuous readout of the sensor is necessary, especially if the sensor acts to trigger safety systems and/or stability systems in the vehicle, such as ABS, ESP and/or airbags.

Moreover, in the event of an accident and/or a safety-related situation, comparatively rapid data availability and therefore a high sampling frequency are necessary, so that a comparatively rapid change in the analog-signal amplitude may be evaluated, and the safety systems and/or stability systems may be triggered promptly if applicable. The method of the present invention now optimizes the analog-to-digital converter with regard to the requirements indicated in such a way that the energy consumption of the analog-to-digital converter is minimized in continuous operation of the sensor system by a sampling frequency which is adapted via a clock generator as a function of the analog signal and therefore in response to the requirements of the analog signal. In particular, the sampling frequency is adapted to the change rate of the analog-signal amplitude and/or to the analog-signal amplitude, so that, for example, in response to comparatively rapid changes in amplitude, the analog-to-digital converter reacts with a comparatively high sampling frequency, while in the case of small or no changes in the analog-signal amplitude, the sampling frequency is comparatively low, thus minimizing the energy consumption of the analog-to-digital converter. The sensor may include an acceleration sensor and/or yaw-rate sensor.

Advantageous embodiments and further refinements of the present invention may be derived from the description herein and the description with reference to the drawing.

According to another further refinement, in a first operating mode of the analog-to-digital converter, the sampling frequency is increased with a rising change rate of the analog signal and is lowered with a decreasing change rate of the analog signal and/or in a second operating mode of the analog-to-digital converter, the sampling frequency is increased with a rising maximum amplitude of the analog signal and is lowered with a decreasing maximum amplitude of the analog signal. Advantageously, the energy consumption of the analog-to-digital converter is thus increased only in case of need, while outside of a case of need, the energy consumption is comparatively low. Particularly in case of need, the data rate is increased, and therefore a higher output bandwidth is simulated, so that a comparatively low energy consumption is attained, accompanied at the same time by high virtual bandwidth of the analog-to-digital converter. A case of need within the meaning of the exemplary embodiments and/or exemplary methods of the present invention includes, for example, a situation with comparatively great amplitudes and/or amplitude changes of the analog signal, i.e., especially in the case of comparatively great accelerations and/or yaw rates, or changes in acceleration and/or changes in yaw rate, which have an effect on the sensor.

According to another development, in a third operating mode of the analog-to-digital converter, the sampling frequency is reduced, and in particular, is set equal to zero in the event the change rate of the analog signal drops below a first threshold value and/or the maximum amplitude of the analog signal drops below a second threshold value. Advantageously, the energy consumption of the analog-to-digital converter, especially outside of a case of need, is thus reduced considerably. In addition, a precise determination and/or change of the third operating mode may be made possible by an adjustment of the first and/or second threshold value, in particular, a tolerance range being adjustable by way of the first and/or second threshold value for reducing the sampling frequency.

According to another refinement, in a fourth operating mode of the analog-to-digital converter, the sampling frequency is increased in response to decreasing maximum amplitudes of the analog signal, while the sampling frequency is lowered in response to rising maximum amplitudes of the analog signal. Advantageously, the precision of the evaluation of the analog signal is thereby increased. Naturally, at comparatively low amplitudes of a signal, the signal-to-noise ratio is less than at higher amplitudes of a signal. A comparatively high sampling frequency in the case of an analog signal having comparatively low amplitudes permits an averaging over a multitude of analog values and/or digital values, so that the noise of the analog signal is suppressed, and a higher resolution is attained. In the case of rising amplitudes, because of the greater signal-to-noise ratio, an averaging is no longer necessary, so that to reduce the energy consumption of the analog-to-digital converter, the sampling frequency is decreased.

According to another development, in a fifth operating mode of the analog-to-digital converter, the sampling frequency is controlled as a function of the analog signal, in doing which, the sampling frequency may be controlled as a function of the integral of the analog signal against a unit of time, so that advantageously, the sampling frequency is controllable by an arbitrary mathematical dependency on the analog signal. The mathematical dependency or function is adaptable specific to the application. For example, to control the sampling frequency as a function of the speed of the sensor system, the sampling frequency is formed as a function of the time integral of the analog signal.

According to another refinement, in a sixth operating mode of the analog-to-digital converter, the analog signal is a function of a speed value, and the sampling frequency may be controlled as a function of the speed value. Especially advantageously, given a speed below the speed value, the energy consumption may therefore be minimized since, for example, a multitude of safety systems and/or stability systems are not appropriate until a specific minimum speed is exceeded. For instance, the operation of the ABS system or a brake-assist system when the vehicle is stationary at a crossing barrier represents an unnecessary consumption of energy. Moreover, the speed with which data is available becomes increasingly important as the speed of a vehicle increases, since with rising speed of the vehicle, the safety systems and/or stability systems must react with increasing rapidity, as well.

According to another development, in a seventh operating mode of the analog-to-digital converter, the sampling frequency is controlled by the clock generator as a function of the analog signal and a further signal of the digital signal-processing device. Thus, an implementation of comparatively complicated functions or dependencies of the sampling frequency on the analog signal is possible on a digital basis in the digital signal-processing device. Moreover, a control of the clock generator by way of the digital signal processing is able to be realized, so that, for example, the sampling frequency is dependent both on the analog signal and the further signal of the digital signal-processing device.

According to another refinement, the digital signal-processing device time-averages a plurality of digital signals, and/or the clock generator carries out a time averaging of the analog signal. The averaging may be done in analog manner and/or in digital manner. The average value of the digital signal-processing device may be used as further signal for the control of the sampling frequency by way of the clock generator.

A further subject matter of the exemplary embodiments and/or exemplary methods of the present invention is a sensor system, the sensor system having a sensor, an analog-to-digital converter, a digital signal-processing device and a clock generator, the clock generator may be provided to set the first, second, third, fourth, fifth, sixth and/or seventh operating mode of the analog-to-digital converter. Especially advantageously, a sensor system is thus realized which uses considerably less energy compared to the related art, and at the same time, the resolution and/or the bandwidth of the sensor system is optimized automatically as needed.

According to another refinement, the sensor system is integrated into a vehicle, and which may be into an electronic safety system, stability system and/or comfort and convenience system of a vehicle.

According to another development, the sensor system is used for the readout of a yaw-rate sensor and or an inertial sensor.

Exemplary embodiments of the present invention are shown in the drawing and explained in greater detail in the following description.

DETAILED DESCRIPTION

Figure 1:
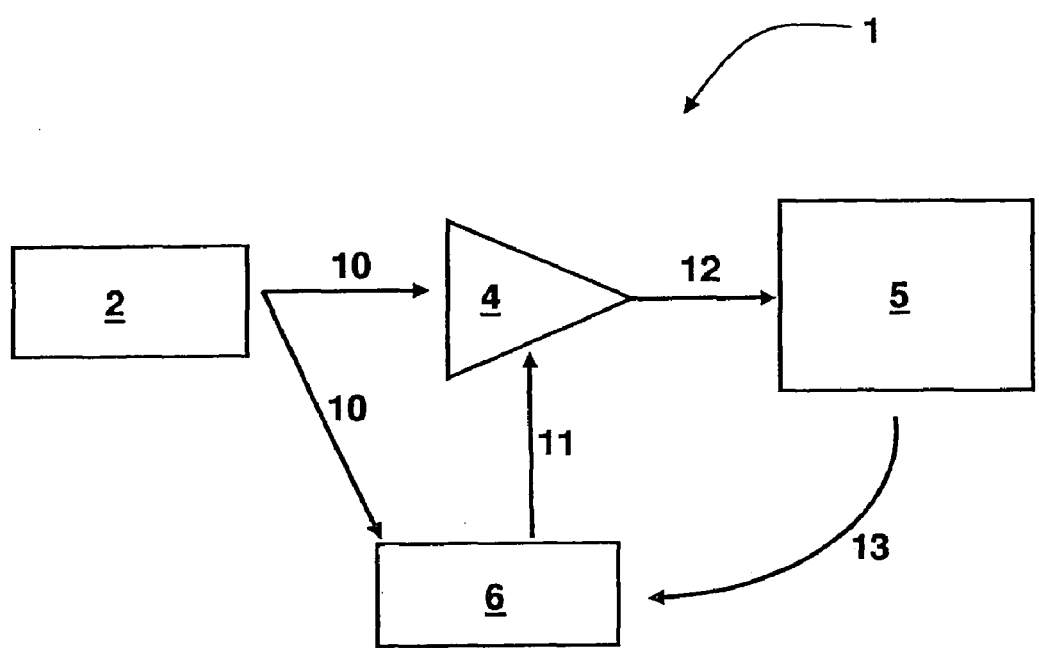
FIG. 1 shows a schematic plan view of a sensor system according to an exemplary specific embodiment of the present invention.

FIG. 1 shows a schematic plan view of a sensor system 1 according to an exemplary specific embodiment of the present invention, sensor system 1 having a sensor 2, an analog-to-digital converter 4 and a digital signal-processing device 5, an analog signal 10 from sensor 2 being transmitted to analog-to-digital converter 4 and to clock generator 6, analog signal 10 being converted to a digital signal 12 by analog-to-digital converter 4 with a sampling frequency 11, and digital signal 12 being transmitted to digital signal-processing device 5. Sampling frequency 11 of analog-to-digital converter 4 is controlled by clock generator 6 as a function of analog signal 10. In particular, sampling frequency 11 is set as a function of the amplitude of analog signal 10 and/or the change in the amplitude of analog signal 10. Sensor 2 includes, in particular, an acceleration sensor and/or yaw-rate sensor.

In a first operating mode of analog-to-digital converter 4, sampling frequency 11 may be increased with a rising change rate of analog signal 10 and is lowered with a decreasing change rate of analog signal 10; in a second operating mode of analog-to-digital converter 4, sampling frequency 11 is increased with a rising maximum amplitude of analog signal 10 and is lowered with a decreasing maximum amplitude of analog signal 10; in a third operating mode of analog-to-digital converter 4, sampling frequency 11 is reduced, and in particular, is set equal to zero in the event the change rate of analog signal 10 drops below a first threshold value and/or the maximum amplitude of analog signal 10 drops below a second threshold value; in a fourth operating mode of analog-to-digital converter 4, sampling frequency 11 is increased in response to decreasing maximum amplitudes of analog signal 10, while sampling frequency 11 is decreased in response to rising maximum amplitudes of analog signal 10; in a fifth operating mode of the analog-to-digital converter, sampling frequency 11 is controlled as a function of analog signal 10, sampling frequency 11 may be controlled as a function of the integral of analog signal 10 against a unit of time; in a sixth operating mode of analog-to-digital converter 4, analog signal 10 is a function of a speed value and sampling frequency 11 may be controlled as a function of the speed value and/or in a seventh operating mode of analog-to-digital converter 4, sampling frequency 11 is controlled by clock generator 6 as a function of analog signal 10 and a further signal 13 of digital signal-processing device 5. Digital signal-processing device 5 may time-average a plurality of digital signals 12 and/or clock generator 6 may carry out a time averaging of analog signal 10.

What is claimed is:

1. A method for operating a sensor system having a sensor, an analog-to-digital converter, and a digital signal-processing device, the method comprising:
   transmitting an analog signal from the sensor to the analog-to-digital converter;
   converting the analog signal to a digital signal using the analog-to-digital converter with a sampling frequency;

transmitting the digital signal to the digital signal-processing device;
further transmitting the analog signal to a clock generator; and
controlling the sampling frequency of the analog-to-digital converter with the clock generator as a function of the analog signal.

2. The method of claim 1, wherein in a first operating mode of the analog-to-digital converter, the sampling frequency is increased with a rising change rate of the analog signal and is lowered with a decreasing change rate of the analog signal.

3. The method of claim 1, wherein in a second operating mode of the analog-to-digital converter, the sampling frequency is increased with a rising maximum amplitude of the analog signal and is lowered with a decreasing maximum amplitude of the analog signal.

4. The method of claim 1, wherein in a third operating mode of the analog-to-digital converter, the sampling frequency is reduced and is set equal to zero in the event the change rate of the analog signal drops below at least one of a first threshold value and a maximum amplitude of the analog signal drops below a second threshold value.

5. The method of claim 1, wherein in a fourth operating mode of the analog-to-digital converter, the sampling frequency is increased in response to decreasing maximum amplitudes of the analog signal, while in response to rising maximum amplitudes of the analog signal, the sampling frequency is lowered.

6. The method of claim 1, wherein in a fifth operating mode of the analog-to-digital converter, the sampling frequency is controlled as a function of one of an analog signal and an integral of the analog signal against a unit of time.

7. The method of claim 1, wherein in a sixth operating mode of the analog-to-digital converter, the analog signal is a function of a speed value, and the sampling frequency is controlled as a function of the speed value.

8. The method of claim 1, wherein in a seventh operating mode of the analog-to-digital converter, the sampling frequency is controlled by a clock generator as a function of the analog signal and a further signal of the digital signal-processing device.

9. The method of claim 1, wherein at least one of the following is satisfied: the digital signal-processing device time-averages a plurality of digital signals; and a clock generator carries out a time averaging of the analog signal.

10. A sensor system, comprising:
a sensor;
an analog-to-digital converter;
a digital signal-processing device; and
a clock generator provided to set a first, second, third, fourth, fifth, sixth and seventh operating mode of the analog-to-digital converter;
wherein an analog signal is transmitted from the sensor to the analog-to-digital converter, the analog signal is converted to a digital signal using the analog-to-digital converter with a sampling frequency, the digital signal is transmitted to the digital signal-processing device, the analog signal is further transmitted to a clock generator, and the sampling frequency of the analog-to-digital converter is controlled with the clock generator as a function of the analog signal.

11. The sensor system of claim 10, wherein the sensor system is integrated into at least one of an electronic safety system, a stability system and a comfort and convenience system of a vehicle.

12. The sensor system of claim 10, wherein the sensor system is used for a readout of at least one of a yaw-rate sensor and an inertial sensor.

13. The system of claim 10, wherein in a first operating mode of the analog-to-digital converter, the sampling frequency is increased with a rising change rate of the analog signal and is lowered with a decreasing change rate of the analog signal.

14. The system of claim 10, wherein in a second operating mode of the analog-to-digital converter, the sampling frequency is increased with a rising maximum amplitude of the analog signal and is lowered with a decreasing maximum amplitude of the analog signal.

15. The system of claim 10, wherein in a third operating mode of the analog-to-digital converter, the sampling frequency is reduced and is set equal to zero in the event the change rate of the analog signal drops below at least one of a first threshold value and a maximum amplitude of the analog signal drops below a second threshold value.

16. The system of claim 10, wherein in a fourth operating mode of the analog-to-digital converter, the sampling frequency is increased in response to decreasing maximum amplitudes of the analog signal, while in response to rising maximum amplitudes of the analog signal, the sampling frequency is lowered.

17. The system of claim 10, wherein in a fifth operating mode of the analog-to-digital converter, the sampling frequency is controlled as a function of one of an analog signal and an integral of the analog signal against a unit of time.

18. The system of claim 10, wherein in a sixth operating mode of the analog-to-digital converter, the analog signal is a function of a speed value, and the sampling frequency is controlled as a function of the speed value.

19. The system of claim 10, wherein in a seventh operating mode of the analog-to-digital converter, the sampling frequency is controlled by a clock generator as a function of the analog signal and a further signal of the digital signal-processing device.

* * * * *